United States Patent
Conaghan et al.

(10) Patent No.: US 7,211,205 B2
(45) Date of Patent: *May 1, 2007

(54) HIGH CONDUCTIVITY INKS WITH IMPROVED ADHESION

(75) Inventors: Brian F. Conaghan, Princeton, NJ (US); Gregory A. Jablonski, Yardley, PA (US); Paul H. Kydd, Lawrenceville, NJ (US); Isabel Mendoza, Middletown, NJ (US); David L. Richard, Fanwood, NJ (US)

(73) Assignee: Parelec, Inc., Rocky Hill, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/353,837

(22) Filed: Jan. 29, 2003

(65) Prior Publication Data

US 2004/0144958 A1 Jul. 29, 2004

(51) Int. Cl.
*H01B 1/02* (2006.01)
*H01B 1/06* (2006.01)
*B22F 5/00* (2006.01)
*B22F 7/00* (2006.01)

(52) U.S. Cl. ............ 252/514; 250/500; 250/512; 250/511; 250/519.3; 106/1.13; 106/1.15; 106/1.19; 427/96; 427/294; 427/553; 430/115; 430/270.1

(58) Field of Classification Search ........ 252/500, 252/510, 511, 512, 514, 519.3; 106/1.13, 106/1.14, 1.15, 1.19; 427/96, 294, 553; 430/115, 430/291, 270.1
See application file for complete search history.

(56) References Cited

U.S. PATENT DOCUMENTS

| | | | |
|---|---|---|---|
| 3,454,518 A * | 7/1969 | Bernard | 524/520 |
| 4,186,244 A | 1/1980 | Deffeyes et al. | 428/570 |
| 4,289,534 A * | 9/1981 | Deffeyes et al. | 106/1.14 |
| 4,371,459 A | 2/1983 | Nazarenko | 252/514 |
| 4,499,010 A * | 2/1985 | Tanino et al. | 252/512 |
| 4,921,623 A | 5/1990 | Yamaguchi et al. | 252/512 |
| 4,950,423 A * | 8/1990 | Sullivan | 252/512 |
| 4,981,730 A * | 1/1991 | Zaleski | 427/393.5 |
| 5,011,758 A | 4/1991 | Detig et al. | 430/100 |
| 5,286,415 A | 2/1994 | Buckley et al. | 252/502 |
| 5,376,403 A | 12/1994 | Capote et al. | 427/96 |
| 5,814,248 A * | 9/1998 | Tani et al. | 252/512 |
| 5,830,389 A | 11/1998 | Capote et al. | 252/512 |
| 5,853,622 A | 12/1998 | Gallagher et al. | 252/512 |
| 5,882,722 A * | 3/1999 | Kydd | 427/96 |
| 5,985,043 A | 11/1999 | Zhou et al. | 148/24 |
| 5,985,456 A | 11/1999 | Zhou et al. | 428/414 |
| 6,017,634 A | 1/2000 | Capote et al. | 428/414 |
| 6,036,889 A * | 3/2000 | Kydd | 252/512 |
| 6,143,356 A | 11/2000 | Jablonski | 427/96 |
| 6,153,348 A * | 11/2000 | Kydd et al. | 430/119 |
| 6,156,237 A | 12/2000 | Kubota et al. | 252/512 |
| 6,214,527 B1 | 4/2001 | Kosaka et al. | 430/319 |
| 6,274,412 B1 * | 8/2001 | Kydd et al. | 438/149 |
| 6,322,620 B1 | 11/2001 | Xiao | 106/31.92 |
| 6,372,158 B1 * | 4/2002 | Hashimoto et al. | 252/514 |
| 6,379,745 B1 | 4/2002 | Kydd et al. | 427/96 |
| 6,743,319 B2 | 6/2004 | Kydd | 156/230 |
| 7,014,885 B1 | 3/2006 | Piqué et al. | 427/294 |
| 2001/0046562 A1 | 11/2001 | Whitefield et al. | 427/372.2 |
| 2002/0195934 A1* | 12/2002 | Bush et al. | 313/509 |

FOREIGN PATENT DOCUMENTS

| | | | |
|---|---|---|---|
| JP | 05-054716 | * | 3/1993 |
| JP | 08283517 A | | 10/1996 |
| JP | 63-278983 | * | 11/1998 |
| WO | WO 99/16556 | | 4/1999 |
| WO | WO 99/16601 | | 4/1999 |
| WO | WO 99/17352 | | 4/1999 |
| WO | WO 99/45077 | | 9/1999 |
| WO | WO 00/29208 | | 5/2000 |
| WO | WO 01/45935 A1 | | 6/2001 |
| WO | WO 01/82315 A1 | | 11/2001 |
| WO | WO 01/87503 A1 | | 11/2001 |

OTHER PUBLICATIONS

Data Sheet-silver Oxalate, 2000.*

* cited by examiner

*Primary Examiner*—Mark Kopec
*Assistant Examiner*—Kallambella Vijayakumar
(74) *Attorney, Agent, or Firm*—McCarter & English, LLP

(57) ABSTRACT

Conductive ink compositions which can be cured to highly conductive metal traces by means of "chemical welding" include adhesion promoting additives for providing improved adhesion of the compositions to various substrates.

23 Claims, No Drawings

HIGH CONDUCTIVITY INKS WITH IMPROVED ADHESION

FIELD OF THE INVENTION

The present invention relates to electrically conductive ink compositions and methods of producing these compositions. The compositions include adhesion promoting additives and can be cured to form highly conductive metal traces which have improved adhesion to substrates.

BACKGROUND OF THE INVENTION

Materials for printing electrical circuits on electrical conductor substrates known as PARMOD® materials are disclosed in U.S. Pat. Nos. 5,882,722, 6,036,889, 6,143,356 and 6,379,745, the entire disclosures of which are expressly incorporated herein by reference. PARMOD® materials have been developed for printing conductive circuits on polymer or paper substrates such as those used for printed wiring boards, flexible circuits and RFID antennae. Typically, polymer thick film conducting materials are made of individual particles which may be in adventitious contact with each other. In contrast, using PARMOD® materials and a simple print-and-heat process for "chemical welding" of pure metals, electrical conductors made of a single-phase continuous well-bonded metal trace are produced. PARMOD® materials also provide a desirable alternative to the conventional thick film compositions that are cured at high temperatures onto ceramic or glass based substrates. PARMOD® materials are cured at temperatures which polymer and paper based substrates can withstand, and provide electrical conductivity comparable to that of the pure metal and greater than that of polymer thick films.

A significant problem that arises in manufacturing conductive circuits on polymer or paper substrates is inadequate adhesion of the metal coating on the substrates. Yet another difficulty is achieving adequate adhesion while maintaining the desired resistivity properties in the electronic circuit. In general, a separate adhesive layer applied to the substrate surface has been required for sufficient adhesion of PARMOD® materials to rigid printed circuits (see, e.g., U.S. Pat. No. 6,379,745). For example, polyimide films are first coated with various adhesive layers before copper and silver PARMOD® compositions are printed on the surface and thermally cured to create flexible printed circuits. Suitable substrates for this purpose include Kapton® type FN with a FEP Teflon® coating; Kapton® types KJ and LJ with low melting polyimide coatings; and polyimide substrates with polyamic acid coatings. Copper PARMOD® compositions have been printed on rigid polyimide-glass laminates coated with a chain extending polyimide adhesive and thermally cured to create rigid printed circuits (see U.S. Pat. Nos. 6,143,356 and 6,379,745). However, because the adhesive layer infiltrates into the porous metal trace during curing, the curing conditions are predominately dictated by the properties of the adhesive rather than the PARMOD® materials which can cure at lower temperatures and in shorter times than the adhesive. Thus, adding the adhesive coating diminishes the advantages provided by the PARMOD®method and compositions. In the case of circuits with drilled holes for through-hole components and vias for electrical connections between layers, coating the holes with adhesive makes it difficult to obtain good bonding to the metal traces. Even if adhesive coatings are selected, suitable adhesive coatings are not widely available on substrates of commercial interest, such as paper and polymer based substrates. In addition, coated substrates are generally more expensive than uncoated substrates. Therefore, although attempts have been made to improve adhesion of conductive coatings, a suitable solution to this problem has not heretofore been developed.

Thus, there is a need for methods and compositions that provide sufficient adhesion of PARMOD® compositions to substrates of interest, and which retain the highly conductive properties of the PARMOD® materials.

SUMMARY OF THE INVENTION

The present application provides conductive ink compositions into which adhesion promoting compounds are incorporated to improve adhesion of the ink compositions to various substrates in the manufacture of electrical conductors. Accordingly, the invention provides a conductive ink composition comprising a reactive organic medium, metal powder or flake, and an adhesion promoting additive. The ink composition may also include an organic liquid vehicle to facilitate mixing and application of the mixture onto the substrate. The ink compositions may further include other additives commonly used in conductive ink compositions.

Preferably, the reactive organic medium comprises a metallo-organic decomposition compound, an organic reactive reagent which can react with the metal powder or flake to form a metallo-organic decomposition compound, or a mixture thereof.

The compositions of the invention are advantageously applied to low-temperature substrates such as polymer, paper and polyimide-based substrates using any suitable printing technique to provide improved low-temperature substrates with well-adhered traces of high electrical conductivity.

The adhesion promoting additive is a polymer or a primary diamine. Preferably, the adhesion promoting additive is a polymer selected from the group consisting of low $T_g$ polyimides, silicones, fluorocarbons, fluoropolymers, soluble (chain extending) polyimides, polyimideamides, polyamic acids and combinations thereof. The adhesion promoting additive may also be a primary diamine, such as 4,4-(1,3-phenylenedioxy)dianiline (RODA) or oxydianiline (ODA). In addition, the adhesion promoting additive is a polymer selected from the group consisting of polyvinylidene chloride, polyvinyl chloride, polyethylene vinyl chloride, polyester, polyurethane, polymethyl methacrylate, epoxy, and copolymers and mixtures thereof.

DETAILED DESCRIPTION OF THE INVENTION

PARMOD® mixtures contain a reactive organic medium and metal flakes and/or metal powders. The reactive organic medium comprises either a metallo-organic decomposition compound or an organic reagent which can form such a compound upon heating in the presence of the metal flakes and/or metal powders, or a mixture thereof. The ingredients are blended together with organic vehicles, if necessary, to improve, viscosity or dispersibility of the ink composition. These ink compositions can be printed on temperature-sensitive substrates, and cured at temperatures low enough so that the substrate is not damaged to form well-consolidated electrical conductors. The curing process occurs in seconds at temperatures as much as 500° C. below the temperatures used for conventional sintering of thick film inks and pastes. During the curing process, material deposited from decomposition of the metallo-organic decomposition compound "chemically welds" the powder constituents of the PARMOD® mixture together into a solid. A porous but continuous metal trace is produced on the substrate surface having a density approximately half that of bulk metal and an electrical conductivity per unit mass which may be as high as half that of the bulk metal.

The compositions of the present invention comprising PARMOD® materials include adhesive promoting agents that improve the application of the PARMOD® materials to various substrates. The adhesive agent is added directly to the PARMOD® material, which enhances the adhesion of the PARMOD® material to the substrate and does not significantly interfere with the physical and chemical properties of the conductive PARMOD® material, e.g., resistivity and conductivity.

The present invention provides a method for incorporating adhesion promoting additives into ink compositions that improves adhesion of the ink compositions to polymer and paper substrates while maintaining high metal conductivity of the compositions after curing. Improved adhesion of the ink compositions on the substrates is observed on both rigid and flexible substrates, such as FR4 epoxy-glass rigid board, high temperature flexible polyimide substrates such as Kapton® H, as well as on low temperature substrates such as polyester and paper.

According to the present invention, traces with improved adhesion and low resistivity can be obtained by curing at temperatures of about 150° C. in 10 minutes or less. The concentration of the adhesion enhancing additive is low enough to maintain significantly higher conductivity of the resulting metal circuit traces than that found for polymer thick film inks, which typically have resistivities of about 25–50 microohms-cm.

The metal component is present in the composition in an amount of about 1 to 20 times the amount of the metallo-organic decomposition compound. The metal constituent comprises metal powder, metal flakes or a mixture thereof. Suitable metals include copper, silver, gold, zinc, cadmium, palladium, iridium, ruthenium, osmium, rhodium, platinum, iron, cobalt, nickel, indium, tin, antimony, lead, bismuth and mixtures thereof. The metal powders suitable for use in the invention preferably have an average particle size in the range of from about 0.05 to 15 μm. The metal flakes preferably have a major dimension between 2 to 15 micrometers, preferably about 5 micrometers, and a thickness of less than 1 micrometer. Metal powders are typically produced by chemical precipitation of the metal to obtain the desired particle size and degree of purity. Metal flakes can be produced by techniques well known in the art, for example, by milling the metal powder with a lubricant, such as a fatty acid or fatty acid soap. Commercially available metal powders and metal flakes may also be used, including flakes sold for electronic applications as constituents of thick film inks and silver-loaded conductive epoxies.

The reactive organic medium provides the environment in which the metal powder mixture is bonded together to form a well-consolidated conductor. The reactive organic medium has, or can form, a bond to the metal via a hetero-atom. The hetero-atom can be oxygen, nitrogen, sulfur, phosphorous, arsenic, selenium or other nonmetallic element, and preferably is oxygen, nitrogen or sulfur. The hetero-atom bond is weaker than the bonds holding the organic moiety together, and is thermally broken to deposit the metal. In most cases the reaction is reversible, so that acid or other organic residue can react with the metal to reform the metallo-organic compound. The reactive organic medium compositions can be made by methods well known in the art and are capable of decomposition to the respective metals at relatively low temperatures. Reactive organic medium compounds are generally described in, e.g., U.S. Pat. No. 6,379,745.

Many classes of organic compounds can function as the reactive organic medium. The reactive organic medium preferably comprises any metallo-organic compound which is readily decomposable to the corresponding metal, i.e., a metallo-organic decomposition compound, an organic reagent which can react with the metal to produce such a compound, or mixtures thereof. Examples of suitable reactive organic mediums are metal soaps and the corresponding fatty acids. Other examples are metal amines and metal mercapto compounds and their corresponding amino and sulfide precursors. Specific examples of preferred reactive organic medium constituents are the carboxylic acids and the corresponding metallic soaps of neodecanoic acid and 2-ethyl hexanoic acid with silver and copper, such as silver neodecanoate.

The adhesion promoting agent is added to the metal containing ink compositions of the present invention to bind the metallic particles together and to provide significantly enhanced adhesion of the ink compositions to substrates. The adhesion promoting agent is added in an amount 0.05 to 2.0 times that of the metallo-organic decomposition compound. The added adhesion promoting compound does not adversely affect the PARMOD® cure chemistry process whereby the metal chemically welds into a continuous metal network. As a result, the conductivity of the PARMOD® materials remains significantly higher than that of polymer thick film inks.

Suitable adhesion promoting agents include polymers, particularly low $T_g$ polyimides, silicones, fluorocarbons and fluoropolymers, soluble (chain extending) polyimides, polyimideamides, polyamic acids and combinations thereof. Suitable adhesion promoting polymers are also disclosed in U.S. Pat. No. 6,143,356. The adhesion promoting additives also include polymers such as polyvinylidene chloride, polyvinyl chloride, polyethylene vinyl chloride, polyester, polyurethane, polymethyl methacrylate, epoxy, and copolymers and mixtures thereof. Suitable adhesion promoting additives also include primary diamines, such as 4,4-(1,3-phenylenedioxy)dianiline (RODA) and oxydianiline (ODA). Examples of combinations of these additives include DARAN® in combination with an acrylic polymer, DARAN® and polystyrene-bautadiene, DARAN® and butyl acrylate-co-methylmethacrylate-co-methacrylic acid, DARAN® and vinyl acetate, and DARAN® and polyurethane-polyester.

The various adhesion promoting additives will provide varying degrees of adhesion for different metals in the ink compositions due to the different curing temperatures of the metallo-organic compounds, e.g., a copper containing compound will cure at 300° C., while a silver containing compound will cure at 150° C.

An organic liquid vehicle in an amount of about 0.05 to 100 times the amount by weight of the metallo-organic decomposition compound may be added to the compositions of the invention. For example, in some cases it may be convenient to add an organic liquid vehicle as a diluent or a rheology-enhancing compound to produce a range of viscosities of printable compositions to enhance the printing characteristics of the ink compositions. Organic liquid vehicles that are not reactive in the consolidation process may be selected. However, organic liquid vehicles that may additionally participate in the "welding" reaction of the PARMOD® may also be used. For example, α-terpineol may be used to reduce the viscosity of copper and silver compositions to facilitate screen printing. α-terpineol also participates in the consolidation reaction by virtue of the acid character of the OH group bonded to an unsaturated ring.

The constituents of the ink compositions are weighed out in the appropriate proportions and blended, mixed with diluents or viscosity modifiers if needed to provide the proper consistency, and milled together by hand roll milling or machine roll milling to provide a homogeneous, printable composition. The fineness of grind of the ink typically is less than 1μ.

Substrates to which the ink compositions of the present invention can be applied include rigid epoxy laminates such as FR-4, polyimide films for flexible circuits such as KAPTON®H, polyester film, paper such as Wausau Exact® Bristol medium card stock, other polymer-based electronic components such as MELINEX® or MYLAR®, metal pads and semiconductor components. Preferred substrates include polyester-based substrates such as polyethylene terephthalate or polyethylene naphthalate, paper-based substrates, polyimide-based substrates and epoxy-based substrates.

The ink compositions of the present invention are applied to the substrate using any convenient printing technology, including screen printing, rotary screen printing, gravure printing, intaglio printing, flexographic printing, letterpress printing, lithographic printing, ink jet printing and electrostatic printing. The thickness and viscosity of the applied compositions will vary depending upon the printing technique used. The thickness of the ink compositions may range from 350 nm with 1 centepoise (cp) viscosity using electrostatic printing, 1 to 4 microns at 50 to 200 cp by gravure printing, 4 to 50 microns by screen printing with viscosities ranging from 30,000 to 100,000 cp, and 10 to 25 microns by rotary screen printing at 3,000 cp.

The compositions are cured by exposure to heat for a short period of time. The time will vary depending upon the temperature to which the substrate can safely be exposed. The time varies from about 8 to 20 minutes, but is typically less than ten minutes to achieve most of the electrical conductivity of which the composition is capable. The temperature can range from about 150° C. to 400° C. and will depend upon the decomposition temperature of the metallo-organic compound.

Silver and gold may be cured in air. Copper and other non-noble metals require a protective atmosphere. Nitrogen, with less than about 3 parts per million of oxygen, has been found suitable for processing copper compositions. Addition of water vapor during the curing process, but not before or after, has been found to be beneficial in curing copper compositions.

The examples described below indicate how the individual constituents of the preferred compositions and the conditions for applying them function to provide the desired results. The examples will serve to further typify the nature of this invention but should not be construed as a limitation to the scope thereof which scope is defined solely in the appended claims.

EXAMPLES

Roll milling was performed on a Ross® three roll mill. Screen printing was performed on a Presco® screen printer. A Hotpack® convection oven was used to cure silver containing compositions; an IR reflow oven was used to cure copper containing compositions.

Adhesion of the ink compositions to the substrates was measured by the "tape test", i.e., Scotch tape was applied and pulled off the substrate surface. On a scale of 0–5, a rating of 5 indicated the best adhesion, i.e., nothing was removed from the substrate surface when the tape was pulled off; a rating of 0 indicated no adhesion, i.e., traces were completely removed by the tape.

Example 1

Ink compositions A and B were prepared using the following ingredients (amounts are in weight %):

|  | Ink A | Ink B |
| --- | --- | --- |
| 10 micron copper powder | 54.4 | 52.1 |
| 2 micron copper powder | 30.1 | 28.8 |
| <100 nm copper powder | 6.8 | 6.5 |
| Neodecanoic acid | 8.0 | 7.7 |
| Ethyl cellulose | 0.1 | 0.1 |
| α-terpineol | 0.6 | 0.6 |
| Polyimide Adhesive (NASA Larc-SI) | 0 | 4.2 |
| TOTAL | 100 | 100 |

The ingredients were blended in a dry box and roll milled to obtain screen printable inks. The inks were screen printed on a polyimide glass laminate substrate and thermally cured for 10 minutes at 350° C. in an IR reflow oven. Ink A did not adhere to the substrate surface. Ink B containing the polyimide adhesive showed partial adhesion to the substrate surface. When the coated substrates were solder dipped, the traces detached from the substrates, but the traces were wet by the solder.

These results show that the addition of solid polyimide resin did provide some adhesion but did not affect the curing of the ink composition. Furthermore, the polyimide did not destroy the solderability of the copper.

Example 2

An ink was prepared with the following ingredients (amounts by weight %):

| 2 micron copper powder | 38.21 |
| --- | --- |
| <100 nm copper powder | 10.94 |
| Neodecanoic acid | 6.36 |
| Polyimide Adhesive (NASA Larc-SI) premixed with neodecanoic acid | 1.57 |
| TOTAL | 57.08 |

The first three components were blended in a dry box and roll milled to a screen printable consistency. The ink was placed on the roll mill, the Larc-SI pre-mix was added to the ink, and the ink was roll milled to a screen printable consistency. The ink was screen printed on an epoxy-glass laminate substrate and thermally cured for 10 minutes at 350° C. in an IR reflow oven. The ink cured to a partially bright copper. When the coated substrate was solder dipped, the trace detached from the substrate, but the trace was wet by the solder. The results show that the addition of the polyimide premix increased the adhesion to the epoxy substrate but did not affect the PARMOD® curing. Furthermore, the polymer addition did not destroy the solderability of the PARMOD® copper composition.

Example 3

Two inks C and D were prepared with the following ingredients (parts by weight %):

|  | Ink C | Ink D |
|---|---|---|
| Silver flake | 82.7 | 81.8 |
| Silver metallo-organic decomposition compound | 10.3 | 10.2 |
| Neodecanoic acid | 6 | 6 |
| Dipropylene glycol methyl ether | 1 | 1 |
| RODA | 0 | 1 |
| TOTAL | 100 | 100 |

The ingredients were pre-mixed by hand and roll milled to make a screen printable ink. The fineness of grind of the ink was less than 1 μm. The inks were screen printed on an uncoated 5 mil polyester substrate and thermally cured at 150° C. for 8 minutes.

The resistivity and adhesion results are shown in Table 1.

TABLE 1

|  | Adhesive Promoting Agent | Resistivity (μΩ-cm) | Adhesion |
|---|---|---|---|
| Ink C | None | — | 0 |
| Ink D | RODA | 20 | 4 |

The results show that the traces of ink C did not adhere well to the substrate surface and did not have a measurable resistivity. Ink D containing the adhesion promoting agent produced traces having a measurable resistivity and significantly improved adhesion to the substrate over ink C.

Example 4

Ink compositions were prepared using the following ingredients (parts by weight %):

| Silver flake | 80 |
|---|---|
| Silver metallo-organic decomposition compound | 12 |
| Neodecanoic acid | 7 |
| Di propylene glycol methyl ether | 1 |
| TOTAL | 100 |
| DARAN ® PVDC latex (WR Grace) | 1, 3, 5, 7 and 9 |

The first four ingredients were pre-mixed by hand and roll milled to make a screen printable ink having a fineness of grind of zero. The PVDC latex was then added to the ink at 1, 3, 5, 7 and 9 weight %. The mixtures were pre-mixed by hand, and roll milled to a fineness of grind of zero. The compositions were screen printed on uncoated 5 mil polyester substrates and thermally cured at 150° C. for 20 minutes. The properties of the resulting traces are shown in Table 2.

TABLE 2

| % PVDC latex | Resistivity (μΩ-cm) | Adhesion |
|---|---|---|
| 1 | 4 | 1 |
| 3 | 7 | 2 |
| 5 | 7 | 2 |
| 7 | 17 | 3 |
| 9 | 22 | 5 |

The results show that the resistivity and adhesion of the traces increased with increasing amounts of the PVDC latex adhesion promoting agent.

Example 5

An ink was prepared with the following ingredients (parts by weight %):

| Silver flake | 81.8 |
|---|---|
| Silver metallo-organic decomposition compound | 10.2 |
| Neodecanoic acid | 6 |
| Di propylene glycol methyl ether | 1 |
| Polyimide Polymer | 1 |
| TOTAL | 100 |

The ingredients were pre-mixed by hand and roll milled to make a screen printable ink. The fineness of grind of the ink was less than 1 μm. The mixture was screen printed on an uncoated 5 mil polyester substrate and thermally cured at 150° C. for 8 minutes or at 150° C. for 16 minutes.

The resistivity and adhesion of the traces are shown in Table 3. The results show that the traces containing polyimide polymer and silver did not adhere to the polyester substrate surface and did not have a measurable resistivity.

Example 6

An ink was prepared using the following ingredients (parts by weight %):

| Silver flake | 80 |
|---|---|
| Silver metallo-organic decomposition compound | 12 |
| Neodecanoic acid | 7 |
| Di propylene glycol methyl ether | 1 |
| TOTAL | 100 |
| Polyvinylchloride (52% solution in DBE solvent) | 4 |

The first four ingredients were pre-mixed by hand and roll milled to make a screen printable ink. The fineness of grind of the ink was less than 1 μm. The polyvinylchloride was then added, the mixture was pre-mixed by hand, and roll milled to a zero of fineness of grind. The ink composition was screen printed and thermally cured at 150° C. for 8 minutes on an uncoated 5 mil polyester substrate.

The resistivity and adhesion measurements of the resulting trace are shown in Table 3. The ink composition containing polyvinylchloride as an adhesion promoting agent had measurable resistivity and good adhesion.

Example 7

An ink was prepared with the following ingredients (parts by weight %):

| | |
|---|---|
| Silver flake | 80 |
| Silver metallo-organic decomposition compound | 12 |
| Neodecanoic acid | 7 |
| Di propylene glycol methyl ether | 1 |
| TOTAL | 100 |
| SAN polymer | 1 |

The first four ingredients were pre-mixed by hand and roll milled to obtain a screen printable ink. The fineness of grind of the ink was zero. SAN polymer dissolved in DBE solvent was then added, the mixture pre-mixed by hand, and roll milled to a zero of fineness of grind. The ink mixture was screen printed on an uncoated 5 mil polyester substrate and thermally cured at 150° C. for 8 minutes.

The resistivity and adhesion of the resulting trace are shown in Table 3. The results show that the trace containing SAN polymer and silver did not adhere to the polyester substrate surface and did not have a measurable resistivity.

Example 8

Ink compositions were prepared using the following ingredients (parts by weight %):

| | |
|---|---|
| Silver flake | 80 |
| Silver metallo-organic Decomposition compound | 12 |
| Neodecanoic acid | 7 |
| Di propylene glycol methyl ether | 1 |
| TOTAL | 100 |
| Epoxy resin | 1, 0.5 or 0.2 |

The first four ingredients were pre-mixed by hand and roll milled to make a screen printable ink. The fineness of grind of the ink was zero. Epoxy resin was added at 1, 0.5 or 0.2 weight %. The ingredients were pre-mixed by hand, and roll milled to a fineness of grind of zero. The ink compositions were screen printed on uncoated 5 mil polyester substrates and thermally cured at 150° C. for 8 minutes.

The resistivity and adhesion measurements of the trace prepared with 1% epoxy resin are shown in Table 3. The results show that the trace containing 1% epoxy resin and silver adhered to the polyester substrate surface, however did not have a measurable resistivity. For the traces containing the lower amounts of epoxy resin, resistivity was decreased but adhesion was also reduced.

Example 9

An ink was prepared with the following ingredients (parts by weight %):

| | |
|---|---|
| Silver flake | 80 |
| Silver metallo-organic decomposition compound | 12 |
| Neodecanoic acid | 7 |
| Di propylene glycol methyl ether | 1 |
| TOTAL | 100 |
| Polyurethane latex | 2 |

The first four ingredients were pre-mixed by hand and roll milled to obtain a screen printable ink. The fineness of grind of the ink was zero. Polyurethane latex was added, the ingredients were pre-mixed by hand, and roll milled to a zero of fineness of grind. The mixture was screen printed on an uncoated 5 mil polyester substrate and thermally cured at 150° C. for 8 minutes.

The resistivity and adhesion of the resulting trace are shown in Table 3. The ink composition containing polyurethane latex as an adhesion promoting agent had measurable resistivity and good adhesion.

Example 10

An ink was prepared with the following ingredients (parts by weight %):

| | |
|---|---|
| Silver flake | 80 |
| Silver metallo-organic decomposition compound | 12 |
| Neodecanoic acid | 7 |
| Di propylene glycol methyl ether | 1 |
| TOTAL | 100 |
| Polyester resin | 1 |

The first four ingredients were pre-mixed by hand and roll milled to obtain a screen printable ink. The fineness of grind of the ink was zero. Polyester resin was added, the mixture pre-mixed by hand, and roll milled to a zero of fineness of grind. The mixture was screen printed on an uncoated 5 mil polyester substrate and thermally cured at 150° C. for 8 minutes.

The resistivity and adhesion of the resulting trace are shown in Table 3. The ink composition containing polyester resin as an adhesion promoting agent had measurable resistivity and good adhesion.

Example 11

An ink was prepared with the following ingredients (parts by weight %):

| | |
|---|---|
| Silver flake | 80 |
| Silver metallo-organic decomposition compound | 12 |
| Neodecanoic acid | 7 |
| Di propylene glycol methyl ether | 1 |
| TOTAL | 100 |
| RODA | 1 |

The first four ingredients were pre-mixed by hand and roll milled to make a screen printable ink. The fineness of grind of the ink was zero. RODA was added, the mixture pre-mixed by hand, and roll milled to a fineness of grind of zero.

The mixture was screen printed on an uncoated 5 mil polyester substrate and thermally cured at 150° C. for 8 minutes.

The resistivity and adhesion of the resulting trace are shown in Table 3. The ink composition containing RODA as an adhesion promoting agent had measurable resistivity and good adhesion.

Example 12

An ink was prepared with the following ingredients (parts by weight %):

| | |
|---|---|
| Silver flake | 80 |
| Silver metallo-organic decomposition compound | 12 |
| Neodecanoic acid | 7 |
| Di propylene glycol methyl ether | 1 |
| TOTAL | 100 |
| ODA | 1 |

The first four ingredients were pre-mixed by hand and roll milled to make a screen printable ink. The fineness of grind of the ink was zero. ODA was added, the mixture pre-mixed by hand, and roll milled to a fineness of grind of zero. The mixture was screen printed on an uncoated 5 mil polyester substrate and thermally cured at 150° C. for 8 minutes.

The resistivity and adhesion of the resulting trace are shown in Table 3. The ink composition containing ODA as an adhesion promoting agent had measurable resistivity and good adhesion.

Example 13

An ink was prepared with the following ingredients (parts by weight %):

| | |
|---|---|
| Silver flake | 80 |
| Silver metallo-organic decomposition compound | 12 |
| Neodecanoic acid | 7 |
| Di propylene glycol methyl ether | 1 |
| TOTAL | 100 |
| Hexamethylene Diamine | 1 |

The first four ingredients were pre-mixed by hand and roll milled to make a screen printable ink. The fineness of grind of the ink was zero. Hexamethylene diamine was added, the mixture pre-mixed by hand, and roll milled to a fineness of grind of zero. The mixture was screen printed on an uncoated 5 mil polyester substrate and thermally cured at 150° C. for 8 minutes.

The resistivity and adhesion of the resulting trace are shown in Table 3. The results show that the trace containing hexamethylene diamine and silver did not adhere to the polyester substrate surface.

TABLE 3

Silver metal on a polyester substrate

| Example | Adhesive | Resistivity (μΩ-cm) | Adhesion |
|---|---|---|---|
| 5 | Polyimide Polymer | 0*/50** | 0*/0** |
| 6 | Polyvinylchloride | 17 | 3 |
| 7 | SAN polymer | >50 | 0 |
| 8 | 1% epoxy resin | >50 | 5 |
| 9 | Polyurethane latex | 20 | 3 |
| 10 | Polyester resin | 30 | 3 |
| 11 | RODA | 15 | 4 |
| 12 | ODA | 30 | 3 |
| 13 | Hexamethylene diamine | 40 | 1 |

*thermally cured at 150° C. for 8 minutes
**thermally cured at 150° C. for 16 minutes The results demonstrate that that the compositions and methods of the invention for incorporating adhesion promoting additives into silver conductive ink compositions improved adhesion of the resulting traces to polymer substrates while maintaining a measurable resistivity after curing (Examples 6 and 9–12).

Silver compositions to which were added polyimide, SAN polymer, or epoxy, which are commonly used to coat substrates before application of conductive material, did not provide suitable adhesion/and or resistivity properties to the silver traces on polyester substrates (Examples 5, 7 and 8).

EXAMPLE 14

| | |
|---|---|
| PARMOD ® silver ink | 96 wt. % |
| DARAN ® 8730 | 3 wt. % |
| polystyrene acrylate latex (Dow) | 1 wt. % |

PARMOD® silver ink containing silver flake, silver necadecanoate in neodecanoic acid with a 6 to 1 ratio of flake to silver neodecanoate and dipropylene glycol methyl ether added at 1.1 weight % was prepared as described in U.S. Pat. No. 6,036,889. The ink, DARAN® and latex were mixed and rolled through a three roll mill. The ink mixture was printed on 175 g/m² paper (Wausau Paper) and cured in a convection oven for 2 and 5 minutes at 135° C. and 150° C.

The resulting traces showed that the ink composition containing the adhesion promoting agents adhered to the paper and had less than a 10% change in resistance after 10 flexes around a ½ inch mandrel.

The invention claimed is:

1. A conductive ink composition for deposition onto a substrate comprising a mixture of
   (a) a metallo-organic decomposition compound;
   (b) a metal flake or powder present in an amount 1 to 20 times the amount of the metallo-organic decomposition compound by weight; and
   (c) a latex polymer adhesion promoting additive.

2. The composition of claim 1, wherein the metal flake is silver.

3. The composition of claim 2, wherein the adhesion promoting additive is a polymer or mixture of polymers selected from the group consisting of polyvinylidene chloride, polyvinyl chloride, polyethylene vinyl chloride, polyester, polystyrene, polyurethane, copolymers thereof, acrylic and styrenic copolymers, or a primary diamine.

4. The composition of claim 1, wherein the metallo-organic decomposition compound is silver neodecanoate.

5. The composition of claim 1, wherein the metal powder has an average particle size of from 0.05 to 15 µm.

6. The composition of claim 1, further comprising an organic liquid vehicle.

7. The composition of claim 6 wherein the organic liquid vehicle is present in an amount of 0.05 to 100 times the amount of the metallo-organic decomposition compound by weight.

8. A conductive ink composition for deposition onto a substrate comprising a mixture of
    (a) a metallo-organic decomposition compound;
    (b) a metal flake or powder present in an amount 1 to 20 times the amount of the metallo organic decomposition compound by weight; and
    (c) a latex polymer adhesion promoting additive in an amount 0.05 to 2.0 times the amount of the metallo-organic decomposition compound by weight.

9. The composition of claim 8, further comprising an organic liquid vehicle.

10. The composition of claim 9, wherein the organic liquid vehicle is present in an amount of 0.05 to 100 times the amount of the metallo-organic decomposition compound by weight.

11. The composition of claim 8, wherein the metal powder has an average particle size of from 0.05 to 15 µm.

12. A method for preparing an electrically conductive ink composition for deposition onto a substrate comprising mixing
    (a) metallo-organic decomposition compound;
    (b) metal flake or powder present in an amount 1 to 20 times the amount of the metallo-organic decomposition compound by weight; and
    (c) a latex polymer adhesion promoting additive in the amount 0.05 to 2.0 times the amount of the metallo-organic decomposition compound by weight to form an electrically conductive ink composition.

13. The method of claim 12, further comprising roll milling the mixture to produce a homogeneous composition.

14. The method of claim 12, wherein the metal powder has an average particle size of from 0.05 to 15 µm.

15. The method of claim 12, wherein the adhesion promoting additive is a polymer or mixture of polymers selected from the group consisting of polyvinylidene chloride, polyvinyl chloride, polyethylene vinyl chloride, polyester, polystyrene, polyurethane, copolymers thereof, acrylic and styrenic copolymers, or a primary diamine.

16. The method of claim 12, wherein the metal is selected from copper and silver.

17. A conductive ink composition for deposition onto a substrate comprising a mixture of
    (a) a metallo-organic decomposition compound;
    (b) a metal flake or powder; and
    (c) a latex polymer adhesion promoting additive present in an amount 0.05 to 2.0 times the amount of the metallo-organic decomposition compound by weight.

18. The composition of claim 17, wherein the metal is silver.

19. The composition of claim 17, wherein the adhesion promoting additive is a polymer or mixture of polymers selected from the group consisting of polyvinylidine chloride, polyvinyl chloride, polyethylene vinyl chloride, polyester, polystyrene, polyurethane, copolymers thereof, or a primary diamine.

20. The composition of claim 17, wherein the metallo-organic decomposition compound is silver neodecanoate.

21. The composition of claim 17, wherein the metal powder has an average particle size of from 0.05 to 15 µm.

22. The composition of claim 17, further comprising an organic liquid vehicle.

23. The composition of claim 22, wherein the organic liquid vehicle is present in an amount of 0.05 to 100 times the amount of the metallo-organic decomposition compound by weight.

* * * * *

UNITED STATES PATENT AND TRADEMARK OFFICE
CERTIFICATE OF CORRECTION

| | |
|---|---|
| PATENT NO. | : 7,211,205 B2 |
| APPLICATION NO. | : 10/353837 |
| DATED | : May 1, 2007 |
| INVENTOR(S) | : Brian F. Conaghan et al. |

It is certified that error appears in the above-identified patent and that said Letters Patent is hereby corrected as shown below:

Column 1, line 60, insert a space after the "®" symbol.

Column 12, line 19, the second instance of the word "that" should be deleted.

Signed and Sealed this

Fourth Day of September, 2007

JON W. DUDAS
*Director of the United States Patent and Trademark Office*